(12) United States Patent  
Abken et al.

(10) Patent No.: US 11,843,070 B2  
(45) Date of Patent: *Dec. 12, 2023

(54) PHOTOVOLTAIC DEVICES INCLUDING DOPED SEMICONDUCTOR FILMS

(71) Applicant: First Solar, Inc., Tempe, AZ (US)

(72) Inventors: Anke Abken, Port Hueneme, CA (US); Markus Gloeckler, Perrysburg, OH (US); Roger T. Green, St. Charles, MO (US); Akhlesh Gupta, Sylvania, OH (US); Upali Jayamaha, Perrysburg, OH (US); Peter Meyers, Christiansted, VI (US); Rick C. Powell, Ann Arbor, MI (US)

(73) Assignee: First Solar, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/111,843

(22) Filed: Dec. 4, 2020

(65) Prior Publication Data

US 2021/0091250 A1    Mar. 25, 2021

Related U.S. Application Data

(60) Division of application No. 16/435,838, filed on Jun. 10, 2019, now Pat. No. 10,861,994, which is a (Continued)

(51) Int. Cl.
*H01L 31/18* (2006.01)
*H01L 31/0304* (2006.01)
(Continued)

(52) U.S. Cl.
CPC .... *H01L 31/1828* (2013.01); *H01L 31/02963* (2013.01); *H01L 31/02966* (2013.01); *H01L 31/03042* (2013.01); *H01L 31/073* (2013.01); *H01L 31/18* (2013.01); *H01L 31/1832* (2013.01); *H01L 31/1864* (2013.01);
(Continued)

(58) Field of Classification Search
CPC ... H01L 31/073; H01L 31/18; H01L 31/1828; H01L 31/1832; H01L 31/1864
See application file for complete search history.

(56) References Cited

U.S. PATENT DOCUMENTS 3,218,203 A * 11/1965 Ruehrwein ............ H01L 31/06  
117/89  
4,207,119 A    6/1980 Tyan  
(Continued)

FOREIGN PATENT DOCUMENTS

CN    1231772 A    10/1999  
JP    H5218480 A    8/1993  
(Continued)

OTHER PUBLICATIONS

Chinese First Office Action, dated Dec. 30, 2016, Chinese Application No. CN201610044784.7.
(Continued)

*Primary Examiner* — Lindsey A Buck  
(74) *Attorney, Agent, or Firm* — MacMillan, Sobanski & Todd, LLC

(57) ABSTRACT

A photovoltaic cell can include a dopant in contact with a semiconductor layer.

20 Claims, 2 Drawing Sheets

Related U.S. Application Data continuation of application No. 14/994,830, filed on Jan. 13, 2016, now Pat. No. 10,319,873, which is a division of application No. 12/262,424, filed on Oct. 31, 2008, now Pat. No. 9,263,608.

(60) Provisional application No. 60/985,019, filed on Nov. 2, 2007.

(51) Int. Cl.
*H01L 31/0296* (2006.01)
*H01L 31/073* (2012.01)
*H01L 31/0224* (2006.01)

(52) U.S. Cl.
CPC .. *H01L 31/022466* (2013.01); *H01L 31/1868* (2013.01); *H01L 31/1884* (2013.01); *Y02E 10/50* (2013.01); *Y02E 10/543* (2013.01); *Y02E 10/544* (2013.01); *Y02P 70/50* (2015.11)

(56) References Cited

U.S. PATENT DOCUMENTS

| | | | |
|---|---|---|---|
| 4,287,383 A | 9/1981 | Peterson | |
| 4,950,615 A * | 8/1990 | Basol | H01L 21/0262 438/95 |
| 5,078,804 A | 1/1992 | Chen et al. | |
| 5,279,678 A | 1/1994 | Jordan et al. | |
| 5,304,499 A | 4/1994 | Bonnet et al. | |
| 5,501,744 A | 3/1996 | Albright et al. | |
| 5,945,163 A | 8/1999 | Powell et al. | |
| 6,040,521 A | 3/2000 | Kushiya et al. | |
| 6,184,057 B1 | 2/2001 | Van Andel et al. | |
| 6,482,719 B1 | 11/2002 | Anjum et al. | |
| 8,748,214 B2 | 6/2014 | DeLuca et al. | |
| 9,147,778 B2 | 9/2015 | Zafar et al. | |
| 9,263,608 B2 | 2/2016 | Powell et al. | |
| 9,318,642 B2 | 4/2016 | Gupta et al. | |
| 9,461,186 B2 | 10/2016 | Jayaraman et al. | |
| 10,319,873 B2 * | 6/2019 | Powell | H01L 31/1884 |
| 10,861,994 B2 | 12/2020 | Abken et al. | |
| 11,158,749 B2 | 10/2021 | Grover et al. | |
| 11,201,257 B2 | 12/2021 | Grover et al. | |
| 11,342,471 B2 | 5/2022 | Grover et al. | |
| 11,502,212 B2 | 11/2022 | Cao et al. | |
| 11,588,069 B2 | 2/2023 | Andreini et al. | |
| 2002/0114128 A1 | 8/2002 | Ryu et al. | |
| 2004/0235214 A1 | 11/2004 | Burgener, II et al. | |
| 2004/0248340 A1 | 12/2004 | Romeo et al. | |
| 2005/0009228 A1 | 1/2005 | Wu et al. | |
| 2005/0257824 A1 * | 11/2005 | Maltby | H01L 31/1884 136/252 |
| 2006/0130891 A1 | 6/2006 | Carlson | |
| 2009/0020149 A1 * | 1/2009 | Woods | H01L 31/0336 136/244 |
| 2011/0146784 A1 | 6/2011 | Addepalli et al. | |

FOREIGN PATENT DOCUMENTS

| | | |
|---|---|---|
| JP | H8500209 A | 1/1996 |
| KR | 1988001346 B1 | 7/1988 |

OTHER PUBLICATIONS

Chinese Second Office Action, dated Sep. 5, 2017, Chinese Application No. CN201610044784.7.
Chinese Third Office Action, dated Sep. 5, 2018, Chinese Application No. CN201610044784.7.
European Extended Search Report, dated Oct. 9, 2017, Application No. EP08845700.7.
Dhere, "Thin-film photovoltaics", Journal of Vacuum Science and Technology, 2005, vol. 23, No. 4, pp. 1208-1214.
Halliday, et al., "Effects of Impurities in CdTe/CdS Structures: Towards Enhanced Device Efficiencies", IEEE, 2006, pp. 408-411.
Romeo et al., "High Efficiency CdTe/CdS Thin Film Solar Cells with Sb2Te3 Back Contact by a Thoroughly Dry Process" 19th European Photovoltaic Solar Energy Conference, 2004, pp. 1718-1720.
Wu et al., "High-Efficiency CdTe Solar Cells on Commercial SnO2/Soda-Lime Glass Prepared by Novel Manufacturing Process", 19th European Photovoltaic Solar Energy Conference, 2004, pp. 1721-1724.
Chou et al., "The impact of MOCVD growth ambient on carrier transport, defects, and performance of CdTe/CdS heterojunction solar cells", Journal of Electronic Materials, 1994, vol. 23, No. 1.
Molva et al., "Acceptor states in CdTe and comparison with ZnTe. General Trends", Physical review B, 1984, vol. 30, No. 6.
Molva et al., "Shallow acceptors in cadmium telluride", Phys. Stat. Sol (b), 1982, vol. 109, pp. 635-644.
Durose et al., "Key Aspects of CdTe/CdS solar cells", Phys. Stat. Sol (b), 2002, No. 2, pp. 1055-1064.
Shah et al., "Properties of Te-rich cadmium telluride thin films fabricated by closed space sublimation technique", Journal of Crystal Growth, 2005, No. 284, pp. 477-485.
Chinese Office Action, dated Jun. 24, 2013, Chinese Application No. 200880101459.3.
PCT International Preliminary Report on Patentability, dated May 4, 2010, Application No. PCT/US2008/081763.
Altamirano-Juarez et al., "Low-resistivity ZnO:F:Al transparent thin films", Solar Energy Materials & Solar Cells 82, 2004, pp. 35-43.
Lee et al., "Characteristics of the CdZnS thin film doped by indium diffusion", Thin Solid Films 416, 2002, pp. 184-189.
Podesta et al., "Influence of the fluorine doping on the optical properties of CdS thin films for photovoltaic applications", Thin Solid Films 511-512, 2006, pp. 448-452.
Israeli Office Action, dated Sep. 12, 2013, IL patent 205245.
Korean Office Action, dated Jan. 12, 2015, KR Application No. 1020107012117.
Indian Examination Report, dated Jun. 29, 2017, IN Application No. 3115/DELNP/2010.
European Communication Pursuant to Article 94(3) EPC, Application No. 08845700.7, dated Jan. 27, 2020.
Intellectual Property India, Examination Report, dated Oct. 29, 2021, Application No. 202018030376.

\* cited by examiner

PHOTOVOLTAIC DEVICES INCLUDING DOPED SEMICONDUCTOR FILMS

CROSS-REFERENCE TO RELATED APPLICATIONS

This application is a Divisional of U.S. patent application Ser. No. 16/435,838, filed on Jun. 10, 2019, which is a Continuation of U.S. patent application Ser. No. 14/994,830, filed on Jan. 13, 2016, now U.S. Pat. No. 10,319,873, which is a Divisional of U.S. patent application Ser. No. 12/262,424, filed on Oct. 31, 2008, now U.S. Pat. No. 9,263,608, and claims the benefit of U.S. Provisional Patent Application 60/985,019, filed on Nov. 2, 2007, each of which is incorporated by reference herein in the entirety.

TECHNICAL FIELD

This invention relates to photovoltaic cells.

BACKGROUND

During the fabrication of photovoltaic devices, layers of semiconductor material can be applied to a substrate with one layer serving as a window layer and a second layer serving as the absorber layer. The window layer can allow the penetration of solar energy to the absorber layer, where the optical energy is converted into electrical energy. Some photovoltaic devices can use transparent thin films that are also conductors of electrical charge. The conductive thin films can be a transparent conductive oxide (TCO), such as fluorine-doped tin oxide, aluminum-doped zinc oxide, or indium tin oxide. The TCO can allow light to pass through a substrate window to the active light absorbing material and also serves as an ohmic contact to transport photogenerated charge carriers away from the light absorbing material. A back electrode can be formed on the back surface of a semiconductor layer. The back electrode can include electrically conductive material, such as metallic silver, nickel, copper, aluminum, titanium, palladium, or any practical combination thereof, to provide electrical connection to the semiconductor layer. The back electrode can be a semiconductor material. Doping the semiconductor layer can improve the efficiency of a photovoltaic device.

SUMMARY

In general, a photovoltaic cell can include a transparent conductive layer and a first semiconductor layer in contact with the transparent conductive layer. The first semiconductor layer can include an oxidant. The transparent conductive layer can be positioned over a substrate. In other circumstances, the transparent conductive layer can be positioned over the first semiconductor layer. The oxidant can be fluorine or oxygen, for example.

In some circumstances, a photovoltaic cell can include a layer between the transparent conductive layer and the first semiconductor layer, wherein the layer contains a dopant. The dopant can include an n-type dopant. A layer containing a dopant can be in contact with a first semiconductor layer. A layer containing a dopant can be in contact with the transparent conductive layer.

A photovoltaic cell can further include a second semiconductor layer in contact with a first semiconductor layer. The second semiconductor layer can include CdTe. The first semiconductor layer can include CdS. The substrate can be glass.

In some circumstances, a photovoltaic cell can further include an additional first semiconductor layer between the layer containing a dopant and the transparent conductive layer. The layer containing a dopant can have a thickness greater than 4 Angstroms. The layer containing a dopant can have a thickness greater than 8 Angstroms. The layer containing a dopant can have a thickness greater than 12 Angstroms.

In another aspect, a photovoltaic cell can include a transparent conductive layer, a first semiconductor layer in contact with the transparent conductive layer, and a second semiconductor layer adjacent to the first semiconductor layer, wherein the first or second semiconductor layer includes a dopant.

In some circumstances, both the first and second semiconductor layer can include a dopant. The dopant in the first semiconductor layer can be different from the dopant in the second semiconductor layer. A transparent conductive layer can be positioned over a substrate. A transparent conductive layer can be positioned over a first semiconductor layer. A first semiconductor layer can include CdS. A second semiconductor layer can include CdTe.

A dopant can be a Group III species. A dopant can be a Group I species. A dopant can be Cu, Ag, or Au. A dopant can be a Group V species. A dopant can have a concentration of greater than 0.5 ppma. A dopant can have a concentration greater than 100 ppma. A dopant can have a concentration greater than 500 ppma.

A method of manufacturing a photovoltaic cell can include depositing a first semiconductor layer in contact with a transparent conductive layer, depositing a second semiconductor layer adjacent to the first semiconductor layer, and introducing a dopant in the first semiconductor layer or the second semiconductor layer.

In some circumstances, a dopant can be introduced to both the first and second semiconductor layer. In some circumstances, the dopant introduced to the first semiconductor layer can be different from the dopant introduced to the second semiconductor layer.

A dopant can be introduced by diffusion. A dopant can be introduced by a vapor. A dopant can be introduced as a mixed powder. A dopant can be introduced as a solid powder. A dopant can be introduced throughout an entire semiconductor layer. A dopant can be added to a portion of a layer. A dopant can be an n-type dopant. A dopant can be a p-type dopant. A dopant can be indium and the mixed powder can be CdS and $In_2S_3$.

A dopant can be introduced during heat treatment. Heat treatment temperature can be about 400 degrees Celsius. A dopant can be applied to a surface of a second semiconductor layer prior to heat treatment.

In another aspect, a method of manufacturing a photovoltaic cell can include depositing a first semiconductor layer in the presence of an oxidant and treating the first semiconductor layer with a dopant.

A first semiconductor layer can be positioned over a substrate. In other circumstances, a first semiconductor layer can be positioned over a metal layer. The transparent conductive layer can be positioned over the first semiconductor layer.

An oxidant can be fluorine or oxygen. A dopant can include an n-type dopant. A dopant can include aluminum or indium. A dopant can be distributed as a layer within a first semiconductor layer.

In another aspect, a system for generating electrical energy can include a multilayered photovoltaic cell, the photovoltaic cell including a transparent conductive layer, a first semiconductor layer in contact with a transparent conductive layer, and a second semiconductor layer over the first semiconductor layer, wherein the first or second semiconductor layer includes a dopant, a first electrical connection connected to the transparent conductive layer, and a second electrical connection connected to a metal layer.

In some circumstances, both the first and second semiconductor layer can include a dopant. In some circumstances, the dopant in the first semiconductor layer can be different from the dopant in the second semiconductor layer.

The transparent conductive layer can be positioned over a substrate. A first semiconductor layer can be positioned over a metal layer. A transparent conductive layer can be positioned over the first semiconductor layer.

The details of one or more embodiments are set forth in the accompanying drawings and the description below. Other features, objects, and advantages will be apparent from the description and drawings, and from the claims.

DETAILED DESCRIPTION

A photovoltaic cell can include a transparent conductive layer on a surface of the substrate, a first semiconductor layer, the substrate supporting the semiconductor layer, and a metal layer in contact with the semiconductor layer. The transparent conductive layer can be positioned over a substrate. In other circumstances, the transparent conductive layer can be positioned over the first semiconductor layer.

A photovoltaic cell can include one or more oxidants or dopants. A photovoltaic cell can include a first semiconductor layer including a dopant or an oxidant, such as oxygen or fluorine. A photovoltaic cell can also include a layer containing a dopant, such as an n-type dopant. A dopant can include a Group III species, such as aluminum or indium.

A layer containing a dopant can be positioned between the transparent conductive layer and the first semiconductor layer. The layer containing the second dopant can contact the transparent conductive layer. In other circumstances the layer containing the dopant can contact the first semiconductor layer. The layer containing the second dopant, such as an n-type dopant, can have a thickness of about 5-15 Angstroms, for example.

Examples of n-type dopants include aluminum and indium. Conventionally, various defects in polycrystalline films have caused doping efficiency of semiconductor layers to remain low. In order to improve doping efficiency, a semiconductor layer can be treated with an oxidant such as oxygen or fluorine. After defects of the semiconductor layer have been passivated with an oxidant, doping efficiency can be improved. Without passivation, the addition of dopants such as In or Al can have negative effects. Thus, doping semiconductor layers in several stages can increase photovoltaic cell efficiency.

A dopant can be added intentionally as an extrinsic dopant. Photovoltaic cells are often processed without any intentional extrinsic dopants in a first semiconductor layer, such as a CdS containing layer, or without any extrinsic dopants in a second semiconductor layer, such as CdTe layer, or both. Doping the first semiconductor layer, or second semiconductor layer, or both, in several stages, can reduce photovoltaic cell instability and increase efficiency.

Figure 1:
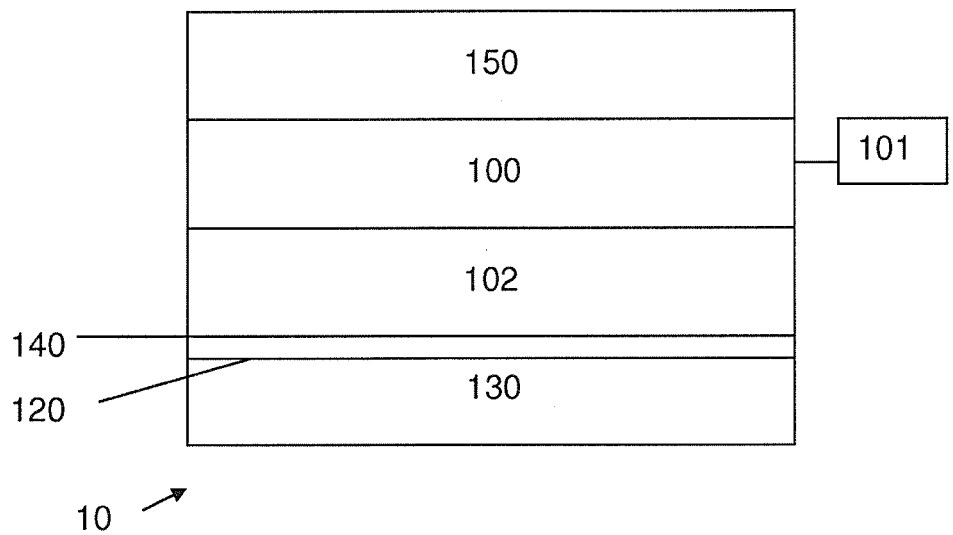
FIG. 1 is a schematic of a substrate with multiple layers.

Referring to FIG. 1, a photovoltaic cell can include semiconductor layers that are doped in at least two stages. For example, a first semiconductor layer 100 can include CdS, for example. The first semiconductor layer, such as a CdS layer, can be treated with an oxidant 101, such as oxygen or fluorine, to passivate the defects in the CdS layer. At this point the oxidant can be introduced at an interface between the transparent conductive layer and the CdS layer. The transparent conductive layer can include a transparent conductive oxide (TCO). Subsequently, a dopant 102, such as an n-type dopant can be introduced. The dopant can be aluminum or indium, for example. The dopant can be introduced to the CdS layer. The dopant can be supplied by a source such as a carrier gas or by diffusion, either from the substrate 130, from the TCO 120 itself, or from a surface layer 140 on the TCO. A second semiconductor layer 150 can be deposited over a first semiconductor layer. A second semiconductor layer can include CdTe, for example. A layer containing a dopant can have a thickness greater than 4 Angstroms, greater than 8 Angstroms, greater than 12 Angstroms, or approximately 15 Angstroms, for example. The structure of a photovoltaic device can also be reversed, for example, such that a transparent conductive layer is on a first semiconductor layer, the first semiconductor layer is on a second semiconductor layer, and the second semiconductor layer is on a metal layer.

Figure 2:
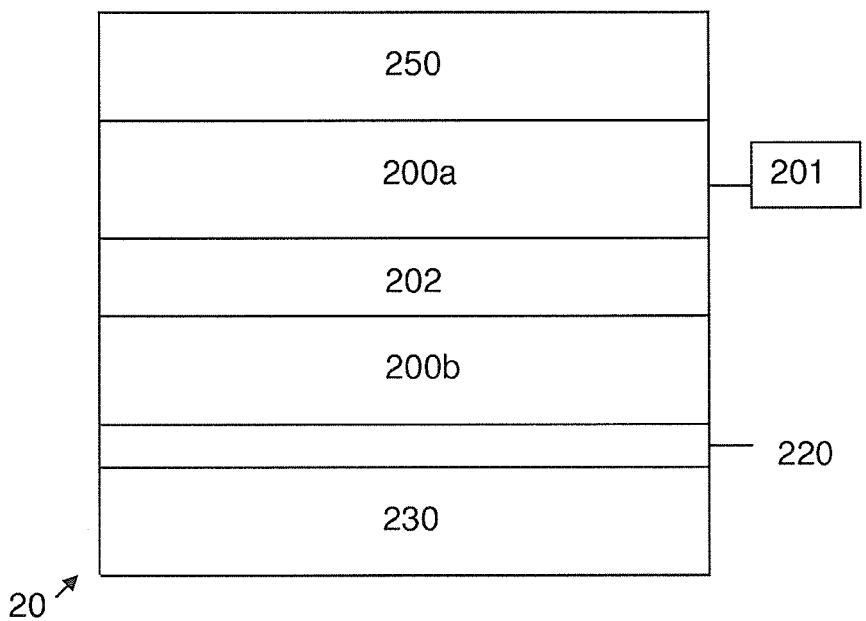
FIG. 2 is a schematic of a substrate with multiple layers.

Referring to FIG. 2, a first semiconductor layer, such as a CdS layer, can be treated with an oxidant 201, such as oxygen or fluorine, to passivate the defects in the CdS layer. Subsequently, a dopant 202, such as aluminum or indium can be introduced to the CdS layer. The dopant can supplied by a source such as a carrier gas or by diffusion, either from the substrate 230, from the TCO 220 itself, or from a surface layer on the TCO. The dopant can form a layer between a first semiconductor layer 200a and an additional first semiconductor layer 200b. The first semiconductor layer 200a can have a thickness greater than a thickness of the additional first semiconductor layer 200b. For example, the thickness of the first semiconductor layer can be greater than 200 Angstroms, greater than greater than 400 Angstroms, and greater than 800 Angstroms, or approximately 900 Angstroms. The thickness of the additional first semiconductor layer can be greater than 50 Angstroms, greater than 75 Angstroms, or approximately 100 Angstroms. A second semiconductor layer 250 can be deposited over a first semiconductor layer. A second semiconductor layer can be treated with a second dopant. A second semiconductor layer can include CdTe, for example. A dopant layer can have a thickness greater than 4 Angstroms, greater than 8 Angstroms, greater than 12 Angstroms, or approximately 15 Angstroms, for example.

Figure 3:
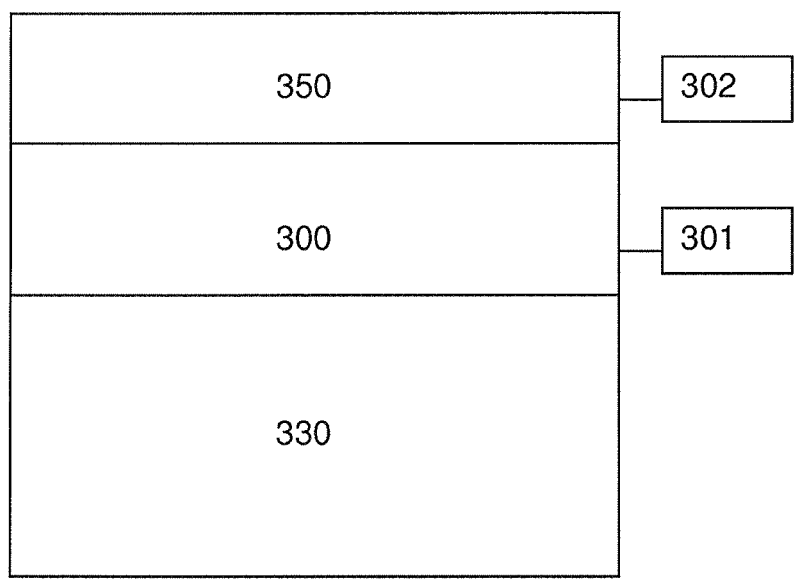
FIG. 3 is a schematic of a substrate with multiple layers.

Referring to FIG. 3, a photovoltaic device can include a first semiconductor layer and a second semiconductor layer. Either the first semiconductor layer or the second semiconductor layer can include a dopant. Alternatively, both the first and second semiconductor layer can include a dopant. A first semiconductor layer 300 can include a dopant 301. Optionally, a second semiconductor layer 350 can include a dopant 302. The first semiconductor layer can be supported by a substrate 330.

Doping a semiconductor layer can be performed in several ways. For example, a dopant can be supplied from an incoming powder, such as a mixed powder (for example, $CdS+In_2S_3$), a carrier gas, or a directly doped powder such as CdS powder. The powder can be a single or multiple phase material. In other circumstances, a dopant can be supplied by diffusion from a layer, such as a substrate layer, a transparent conductive layer, or a semiconductor layer. A dopant may be added throughout a semiconductor layer, or through a portion of a layer.

A dopant for a first semiconductor layer can be added by diffusion from the transparent conductive layer or from a surface layer on the transparent conductive layer. Alternatively, a dopant for the first semiconductor layer can be added by an incoming powder or carrier gas fed into a vapor transport deposition system. A dopant for a first semiconductor layer can be volatilized along with the first semiconductor at temperatures less than 1500° C., less than 1400° C., less than 1200° C., less than 1000° C., or less than 800° C., for example. The volatile species can be atomic or a sulfide molecule, such as $In_2S$. Indium can be an effective dopant because it has a reasonably vapor pressure at typical CdS distributor temperatures (approximately 1100° C.).

Doping a second semiconductor layer, such as CdTe, can be performed in several ways. For example, a dopant can be supplied along with a CdTe source powder into a vapor transport deposition (VTD) distributor system. The dopant for a second semiconductor layer can be introduced as a powder (i.e. a single or multiple phase material) or in a carrier gas. Alternatively, a dopant for a second semiconductor layer can be introduced by deposition of an outer layer onto the second semiconductor layer. For example, an outer layer may contain a dopant, which can diffuse into the CdTe layer.

P-type doping can be effective for a second semiconductor layer, such as CdTe. Group V (for example, N, P, As, Sb, or Bi) and Group I (for example, Li, Na, K, Rb, Cs, Cu, Ag, or Au) elements can be effective dopants for a second semiconductor layer. Phosphorous (P), arsenic (As), antimony (Sb), sodium (Na), potassium (K), rubidium (Rb) present no vaporization problems when introduced into the VTD system operating at typical CdTe distributor temperatures (approximately 900-1100° C.).

A dopant for a second semiconductor layer can be introduced during heat treatment. Heat treatment can be performed with $CdCl_2$ flux. Group I and Group V species such as chloride compounds, can be added to the flux solution that is applied to an outer surface of the second semiconductor layer prior to heat treatment. During heat treatment, recrystallization can occur, thereby making doping distribution within the film possible.

Dopant incorporation can be affected by the concentration of vacancy defects. Vacancy concentration can be controlled by vapor phase overpressure. For example, excess Cd or Te can be applied to alter electronic defects in the final device. Cd or Te overpressure can be achieved by introduction of excess Cd or Te in the CdTe source powder. This can be achieved by a two-phase powder blend or by an off-stoichiometric source material. A material can be off-stoichiometric by greater than 5%, greater than 10%, or greater than 15%, such as approximately 20%.

A dopant can be applied in any concentration, for example, greater than 0.5 ppma, greater than 50 ppma, greater than 500 ppma, or between 1-1000 ppma, for example. Certain gas source dopants, such as those containing nitrogen, for example, may decompose too readily in a heated CdTe distributor, and thus, can be introduced in a secondary, lower temperature distribution system. Dopants can be added throughout an entire semiconductor layer, or into only a portion of the layer by using multi-layer VTD configuration, for example.

A CdS layer can be treated with a dopant such as indium in several ways. In one example, the incorporation of indium in a CdS layer via $In_2S_3$ and a source powder has resulted in improved luminescence. In another example, a CdS layer was doped directly with indium, and extra sulfur lead to an increase in indium incorporation.

A CdTe layer can also be treated with a dopant such as sodium in several ways. In one example, a CdTe layer was doped with sodium using $Na_2S$ powder. The addition of Na resulted in changes in recrystallization during subsequent chloride heat treatment, suggesting that Na doping made the $CdCl_2$ recrystallization flux more active. Similar results were found with RbCl doping.

A CdTe layer can also be doped with P, As, Sb, Na, Rb, or Cu. In yet another example, a CdTe layer doped with Cu was shown to exhibit improved electrical signals. The addition of extra Te to the CdTe powder resulted in improved ability to dope the films. In addition, Cd-rich conditions resulted in a change in film grain structure suggesting the improved ability to dope the films.

A common photovoltaic cell can have multiple layers. The multiple layers can include a bottom layer that is a transparent conductive layer, a capping layer, a window layer, an absorber layer and a top layer. Each layer can be deposited at a different deposition station of a manufacturing line with a separate deposition gas supply and a vacuum-sealed deposition chamber at each station as required. The substrate can be transferred from deposition station to deposition station via a rolling conveyor until all of the desired layers are deposited. Additional layers can be added using other techniques such as sputtering. Electrical conductors can be connected to the top and the bottom layers respectively to collect the electrical energy produced when solar energy is incident onto the absorber layer. A top substrate layer can be placed on top of the top layer to form a sandwich and complete the photovoltaic cell.

The bottom layer can be a transparent conductive layer, and can be, for example, a transparent conductive oxide such as tin oxide or tin oxide doped with fluorine. Deposition of a semiconductor layer at high temperature directly on the transparent conductive oxide layer can result in reactions that negatively impact of the performance and stability of the photovoltaic device. Deposition of a capping layer of material with a high chemical stability (such as silicon dioxide, dialuminum trioxide, titanium dioxide, diboron trioxide and other similar entities) can significantly reduce the impact of these reactions on device performance and stability. The thickness of the capping layer should be minimized because of the high resistivity of the material used. Otherwise a resistive block counter to the desired current flow may occur. A capping layer can reduce the surface roughness of the transparent conductive oxide layer by filling in irregularities in the surface, which can aid in deposition of the window layer and can allow the window layer to have a thinner cross-section. The reduced surface roughness can help improve the uniformity of the window layer. Other advantages of including the capping layer in photovoltaic cells can include improving optical clarity, improving consistency in band gap, providing better field strength at the junction and providing better device efficiency as measured by open circuit voltage. Capping layers are described, for example, in U.S. Patent Publication 2005/0257824, which is incorporated by reference in its entirety.

The window layer and the absorbing layer can include, for example, a binary semiconductor such as group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, MnO, MnS, MnTe, AlN, AlP, AlAs, AlSb, GaN, GaP, GaAs, GaSb, InN, InP, InAs, InSb, TlN, TlP, TlAs, TlSb, or mixtures thereof. An example of a window layer and absorbing layer is a layer of CdS coated by a layer of CdTe. A top layer can cover the semiconductor layers. The top layer can include a metal such as, for example, aluminum, molybdenum, chromium, cobalt, nickel, titanium, tungsten, or alloys thereof. The top layer can also include metal oxides or metal nitrides or alloys thereof.

Deposition of semiconductor layers in the manufacture of photovoltaic devices is described, for example, in U.S. Pat. Nos. 5,248,349, 5,372,646, 5,470,397, 5,536,333, 5,945, 163, 6,037,241, and 6,444,043, each of which is incorporated by reference for its disclosure with respect to deposition methods and compositions. The deposition can involve transport of vapor from a source to a substrate, or sublimation of a solid in a closed system. An apparatus for manufacturing photovoltaic cells can include a conveyor, for example a roll conveyor with rollers. Other types of conveyors are possible. The conveyor transports substrate into a series of one or more deposition stations for depositing layers of material on the exposed surface of the substrate. Conveyors are described in U.S. Pat. No. 9,017,480, which is hereby incorporated by reference.

The deposition chamber can be heated to reach a processing temperature of not less than about 450° C. and not more than about 700° C., for example the temperature can range from 450-550° C., 550-650° C., 570-600° C., 600-640° C. or any other range greater than 450° C. and less than about 700° C. The deposition chamber includes a deposition distributor connected to a deposition vapor supply. The distributor can be connected to multiple vapor supplies for deposition of various layers or the substrate can be moved through multiple and various deposition stations with its own vapor distributor and supply. The distributor can be in the form of a spray nozzle with varying nozzle geometries to facilitate uniform distribution of the vapor supply.

The bottom layer of a photovoltaic cell can be a transparent conductive layer. A thin capping layer can be on top of and at least covering the transparent conductive layer in part. The next layer deposited is the first semiconductor layer, which can serve as a window layer and can be thinner based on the use of a transparent conductive layer and the capping layer. The next layer deposited is the second semiconductor layer, which serves as the absorber layer. Other layers, such as layers including dopants, can be deposited or otherwise placed on the substrate throughout the manufacturing process as needed.

The transparent conductive layer can be a transparent conductive oxide, such as a metallic oxide like tin oxide, which can be doped with, for example, fluorine. This layer can be deposited between the front contact and the first semiconductor layer, and can have a resistivity sufficiently high to reduce the effects of pinholes in the first semiconductor layer. Pinholes in the first semiconductor layer can result in shunt formation between the second semiconductor layer and the first contact resulting in a drain on the local field surrounding the pinhole. A small increase in the resistance of this pathway can dramatically reduce the area affected by the shunt.

A capping layer can be provided to supply this increase in resistance. The capping layer can be a very thin layer of a material with high chemical stability. The capping layer can have higher transparency than a comparable thickness of semiconductor material having the same thickness. Examples of materials that are suitable for use as a capping layer include silicon dioxide, dialuminum trioxide, titanium dioxide, diboron trioxide and other similar entities. Capping layer can also serve to isolate the transparent conductive layer electrically and chemically from the first semiconductor layer preventing reactions that occur at high temperature that can negatively impact performance and stability. The capping layer can also provide a conductive surface that can be more suitable for accepting deposition of the first semiconductor layer. For example, the capping layer can provide a surface with decreased surface roughness.

The first semiconductor layer can serve as a window layer for the second semiconductor layer. The first semiconductor layer can be thinner than the second semiconductor layer. By being thinner, the first semiconductor layer can allow greater penetration of the shorter wavelengths of the incident light to the second semiconductor layer.

The first semiconductor layer can be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, MnO, MnS, MnTe, AN, AlP, AlAs, AlSb, GaN, GaP, GaAs, GaSb, InN, InP, InAs, InSb, TlN, TlP, TlAs, TlSb, or mixtures or alloys thereof. It can be a binary semiconductor, for example it can be CdS. The second semiconductor layer can be deposited onto the first semiconductor layer. The second semiconductor can serve as an absorber layer for the incident light when the first semiconductor layer is serving as a window layer. Similar to the first semiconductor layer, the second semiconductor layer can also be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, MnO, MnS, MnTe, AlN, AlP, AlAs, AlSb, GaN, GaP, GaAs, GaSb, InN, InP, InAs, InSb, TlN, TlP, TlAs, TlSb, or mixtures thereof.

The second semiconductor layer can be deposited onto a first semiconductor layer. A capping layer can serve to isolate a transparent conductive layer electrically and chemically from the first semiconductor layer preventing reactions that occur at high temperature that can negatively impact performance and stability. The transparent conductive layer can be deposited over a substrate.

A number of embodiments have been described. Nevertheless, it will be understood that various modifications may be made without departing from the spirit and scope of the invention. For example, the semiconductor layers can include a variety of other materials, as can the materials used for the buffer layer and the capping layer. Accordingly, other embodiments are within the scope of the following claims.

What is claimed is:

1. A method for forming an absorber layer of a photovoltaic cell comprising:
depositing the absorber layer, wherein:
the absorber layer comprises a mixture of CdTe and at least one semiconductor selected from the group consisting of ZnO, ZnS, ZnSe, ZnTe, CdO, CdS, CdSe, MgO, MgS, MgSe, MgTe, HgO, HgS, HgSe, HgTe, MnO, MnS, MnTe, AN, AlP, AlAs, AlSb, GaN, GaP, GaAs, GaSb, InN, InP, InAs, InSb, TlN, TlP, TlAs, and TlSb; and
the absorber layer comprises a Group V dopant;
applying a flux solution to a surface of the absorber layer, wherein the flux solution comprises a chloride compound, and a Group I element;
heat treating the absorber layer with the flux solution, whereby the Group I element is distributed within the absorber layer.

2. The method of claim 1, wherein the Group I element comprises copper (Cu).

3. The method of claim 1, wherein the Group I element comprises silver (Ag).

4. The method of claim 1, wherein the Group I element comprises gold (Au).

5. The method of claim 1, wherein the Group I element comprises at least one of lithium (Li), sodium (Na), potassium (K), rubidium (Rb), or cesium (Cs).

6. The method of claim 1, wherein the Group I element comprises at least one of: sodium (Na), potassium (K), or rubidium (Rb).

7. The method of claim 1, wherein the Group V dopant comprises nitrogen (N).

8. The method of claim 1, wherein the Group V dopant comprises phosphorus (P).

9. The method of claim 1, wherein the Group V dopant comprises arsenic (As).

10. The method of claim 1, wherein the Group V dopant comprises antimony (Sb).

11. The method of claim 1, wherein the Group V dopant comprises bismuth (Bi).

12. The method of claim 1, wherein the absorber layer comprises a mixture of CdTe and CdSe.

13. The method of claim 1, wherein the absorber layer comprises a mixture of CdTe and ZnTe.

14. The method of claim 1, wherein a concentration of the Group V dopant in the absorber layer is between 0.5 ppma to 500 ppma.

15. The method of claim 1, wherein the chloride compound comprises cadmium chloride ($CdCl_2$), and wherein the flux solution further comprises a chloride of the Group I element.

16. The method of claim 1, comprising: depositing a top layer over the semiconductor absorber layer, wherein the top layer comprises a metal nitride, and wherein the metal nitride, includes at least one of: aluminum, molybdenum, chromium, cobalt, nickel, titanium, or tungsten.

17. A method for forming an absorber layer of a photovoltaic cell comprising:
depositing the absorber layer, wherein depositing the absorber layer comprises:
vaporizing a source material to form a semiconductor vapor with a vapor transport deposition system having a distributor;
distributing the semiconductor vapor via the distributor to a deposition chamber, wherein the semiconductor vapor comprises Cd and Te;
applying excess Cd or Te to the semiconductor vapor, whereby:
the vapor is off-stoichiometric compared to CdTe,
a vapor phase overpressure of Cd or Te is introduced to the semiconductor vapor, and
the absorber layer comprises a mixture of CdTe and at least one semiconductor selected from the group consisting of ZnO, ZnS, ZnSe, ZnTe, CdO, CdS, CdSe, MgO, MgS, MgSe, MgTe, HgO, HgS, HgSe, HgTe, MnO, MnS, MnTe, AN, AlP, AlAs, AlSb, GaN, GaP, GaAs, GaSb, InN, InP, InAs, InSb, TlN, TlP, TlAs, and TlSb; and
introducing a Group V dopant into the absorber layer;
applying a flux solution to a surface of the absorber layer, wherein the flux solution comprises a chloride compound, and a Group I element; and
heat treating the absorber layer with the flux solution.

18. The method of claim 1, wherein the Group V dopant is introduced by a vapor.

19. The method of claim 1, wherein the Group V dopant is applied to a surface of the absorber layer prior to the step of heat treating the absorber layer with the flux solution.

20. A method for forming an absorber layer of a photovoltaic cell comprising:
depositing the absorber layer, wherein the absorber layer comprises a mixture of CdTe and CdSe, and wherein the absorber layer comprises a Group V dopant at a concentration between 0.5 ppma to 500 ppma;
applying a flux solution to a surface of the absorber layer, wherein the flux solution comprises $CdCl_2$, and wherein the flux solution comprises a Group I element; and
heat treating the absorber layer with the flux solution.

* * * * *